United States Patent
Li

(10) Patent No.: US 12,112,973 B2
(45) Date of Patent: Oct. 8, 2024

(54) SEMICONDUCTOR STRUCTURE AND METHOD FOR MANUFACTURING THE SAME

(71) Applicant: CHANGXIN MEMORY TECHNOLOGIES, INC., Hefei (CN)

(72) Inventor: Tao Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 429 days.

(21) Appl. No.: 17/456,009

(22) Filed: Nov. 22, 2021

(65) Prior Publication Data

US 2022/0130716 A1    Apr. 28, 2022

Related U.S. Application Data

(63) Continuation of application No. PCT/CN2021/110881, filed on Aug. 5, 2021.

(30) Foreign Application Priority Data

Oct. 23, 2020    (CN) .......................... 202011149559.2

(51) Int. Cl.
*H01L 21/762*    (2006.01)
*H01L 21/285*    (2006.01)

(52) U.S. Cl.
CPC .. *H01L 21/76224* (2013.01); *H01L 21/28556* (2013.01)

(58) Field of Classification Search
None
See application file for complete search history.

(56) References Cited

U.S. PATENT DOCUMENTS

| | | | |
|---|---|---|---|
| 9,873,942 B2 | 1/2018 | Pomarede | |
| 2001/0054769 A1* | 12/2001 | Raaijmakers | H01L 21/7681 257/E21.171 |
| 2011/0244673 A1 | 10/2011 | Cho et al. | |
| 2022/0336618 A1* | 10/2022 | Cheng | H01L 27/0886 |

FOREIGN PATENT DOCUMENTS

| | | |
|---|---|---|
| CN | 1226079 A | 8/1999 |
| CN | 102804348 A | 11/2012 |
| CN | 107527805 A | 12/2017 |
| CN | 108389837 A | 8/2018 |
| CN | 110867408 A | 3/2020 |
| EP | 0404101 A1 | 12/1990 |
| JP | H059253 A | 2/1993 |
| KR | 20130022950 A | 3/2013 |

OTHER PUBLICATIONS

International Search Report as cited in PCT Application No. PCT/CN2021/110881 mailed Nov. 12, 2021, 4 pages.

* cited by examiner

*Primary Examiner* — Asok K Sarkar
(74) *Attorney, Agent, or Firm* — Kilpatrick Townsend & Stockton LLP

(57) ABSTRACT

The embodiment of the present invention provides a semiconductor structure and a manufacturing method thereof. The semiconductor structure comprises: a substrate having a trench therein; a first layer covering the bottom and the sidewall of the trench; and a second layer covering the surface of the first layer, wherein the step coverage of the second layer is different from the step coverage of the first layer. The embodiment of the invention is conducive to obtaining a multi-layer structure with preset step coverage.

11 Claims, 2 Drawing Sheets

SEMICONDUCTOR STRUCTURE AND METHOD FOR MANUFACTURING THE SAME

CROSS-REFERENCE TO RELATED APPLICATIONS

This application is a continuation application of International Patent Application No. PCT/CN2021/110881, filed on Aug. 5, 2021, which claims priority to Chinese Patent Application No. 202011149559.2, filed with the Chinese Patent Office on Oct. 23, 2020 and entitled "SEMICONDUCTOR STRUCTURE AND METHOD FOR MANUFACTURING THE SAME". International Patent Application No. PCT/CN2021/110881 and Chinese Patent Application No. 202011149559.2 are incorporated herein by reference in their entireties.

TECHNICAL FIELD

The application relates to the semiconductor field, and in particular to a semiconductor structure and a manufacturing method thereof.

BACKGROUND

Existing layer manufacturing processes are dedicated to precise control of layer thickness, high step coverage and good layer thickness uniformity. However, for some special layers, the step coverage needs to be reduced to meet the electrical requirements without changing the properties of the layers.

At present, the low pressure chemical vapor deposition process (LPCVD) can achieve lower step coverage but cannot control the step coverage accurately and stably.

SUMMARY

The embodiments of the present invention provide a semiconductor structure and a manufacturing method thereof, which facilitates the acquisition of a multi-layer structure with high step coverage.

An embodiment of the invention provides a semiconductor structure, comprising: a substrate having a trench therein; a first layer covering the bottom and the sidewall of the trench; and a second layer covering the surface of the first layer, wherein the step coverage of the second layer is different from the step coverage of the first layer.

Another aspect of the invention provides a manufacturing method of a semiconductor structure, comprising: providing a substrate having a trench therein; forming a first layer covering the bottom and the sidewall of the trench; and forming a second layer covering the surface of the first layer, wherein the step coverage of the second layer is different from the step coverage of the first layer.

BRIEF DESCRIPTION OF DRAWINGS

One or more embodiments are illustrated by way of example with reference to the accompanying drawings, which are not to be limiting to the embodiments, and the figures in the drawings are not to be limiting to scale unless specifically stated.

DESCRIPTION OF EMBODIMENTS

In order to further clarify the purpose, technical schemes and advantages of the embodiments of the present invention, the embodiments of the present invention will be described in detail below with reference to the accompanying drawings. However, one of ordinary skill in the art will appreciate that in various embodiments of the present invention a plurality of technical details have been presented for readers to better understand this application. However, even without these technical details and various changes and modifications based on the following embodiments, the technical schemes claimed herein may be realized.

FIGS. 1-5 are schematic illustrations corresponding to each step of the manufacturing method of the semiconductor structure provided by the embodiment of the present invention.

Figure 1:
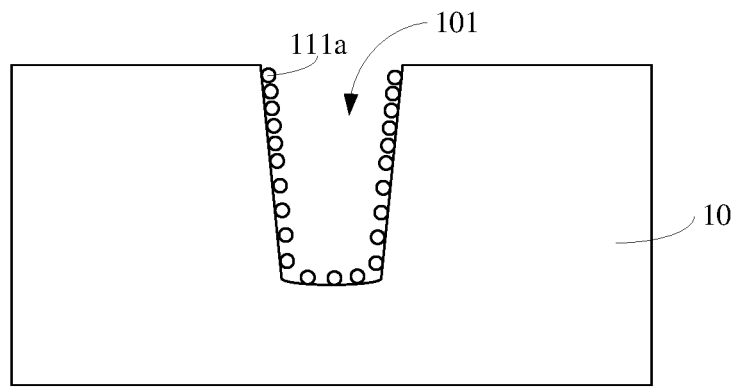
FIGS. 1-5 are schematic illustrations corresponding to each step in the manufacturing method of the semiconductor structure provided by the embodiments of the present invention.
Figure 2:
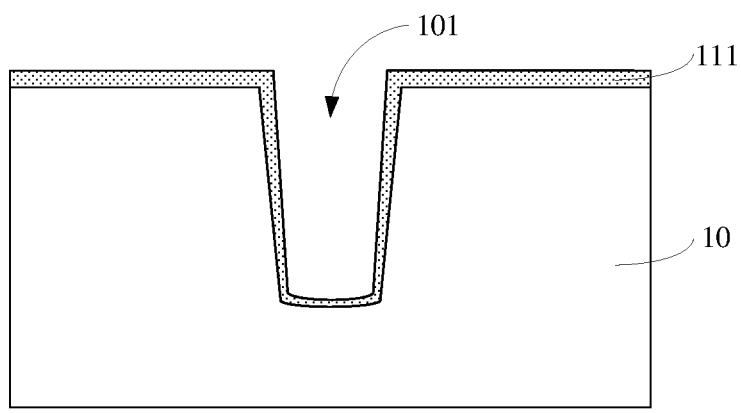

Referring to FIGS. 1 and 2, a substrate 10 is provided and a first layer 111 is formed.

The substrate 10 has a trench 101 therein and the material of the substrate 10 comprises semiconductor materials such as silicon or germanium, wherein the present embodiment is illustrated by way of example with silicon as the material of the substrate 10.

In an alternative embodiment, the first layer 111 is formed through the reaction of the functional group 111a with the substrate 10. The functional group 111a comprises hydroxyl radicals reacting with silicon to form the materials of silica and derivative water, which constitute the first layer 111; and in other embodiments, the material of the first layer may also be silicon nitride.

In an alternative embodiment, the first layer is formed by functional groups immobilizing the preset material molecules. After the formation of the functional groups which covers the sidewall and bottom of the trench, preset gaseous material molecules are blown to the surface of the trench and are immobilized by the functional groups on the sidewall of the trench to form a first layer.

In an alternative embodiment, the functional groups immobilize the preset material molecules to form the first layer in two ways: first, the preset material molecules, which are the constituent material of the first layer, do not react with the functional groups, that is, they do not produce derivatives and are only bound through chemical bonds or intermolecular forces; second, the preset material molecules react with the functional groups to form the constituent material of the first layer.

In an alternative embodiment, the first layer may also be formed through the reaction of the first precursor and the second precursor, wherein the functional groups serve to immobilize the first precursor. After the formation of functional groups which cover the sidewall and bottom of the trench, the first precursor and the second precursor are successively blown to the surface of the trench, wherein the first precursor is immobilized by the functional groups, and the second precursor reacts with the immobilized first precursor to generate preset material molecules to form the first layer.

In an alternative embodiment, the first layer 111 with lower step coverage is formed first, followed by the formation of the second layer (not shown) with higher step coverage, which helps to avoid the first layer 111 from amplifying the surface defects of the second layer as well as to repair the surface defects of the first layer 111, thereby reducing the difficulty of repairing the surface defects and generating good surface properties in the overall layer formed by the first layer 111 and the second layer.

The second layer with higher step coverage can maintain or repair the surface defects of the first layer, which in turn helps to prevent the layer with the lower step coverage from amplifying the defects of the other layer with the higher step coverage, thereby ensuring that the overall layer has good surface properties.

In an alternative embodiment, the layer with higher step coverage can also be formed in advance to repair the damage or defects on the bottom and sidewall of the trench.

In an alternative embodiment, the low pressure chemical vapor deposition process is employed to form the functional group 111a, which is a hydroxyl radical. The process steps for the formation of functional groups 111a comprise: blowing mixed gas containing hydrogen and oxygen at a specific pressure onto the surface of the substrate 10; raising the temperature of the reaction chamber to allow the reaction of hydrogen and oxygen to generate hydroxyl radicals. The hydroxyl radicals generated can be oxidized with the substrate 10 to form the constituent material of the first layer 111, namely silica.

During the low pressure chemical vapor deposition process, the contact between the blown mixed gas and the surface of the substrate 10 can attenuate the air pressure of the mixed gas, whereas the mixed gas is in continuous contact with the surface of the sidewall of the substrate 10 as it diffuses from the top to the bottom of the trench 101. Therefore, the air pressure at the top of the trench 101 is greater than the air pressure at the bottom of the trench 101 after the mixed gas is blown. The air pressure of the mixed gas decreases from the top towards the bottom of the trench 101.

In an alternative embodiment, since the average free path is shorter with higher pressure in the reaction of hydrogen and oxygen, the number of hydroxyl radicals generated at the top is larger than that at the bottom of the trench 101; furthermore, after the floating hydroxyl radicals are attached to the sidewall of the trench 101, the density of the hydroxyl radicals covering the top sidewall of the trench 101 is higher than density of the hydroxyl radicals covering the bottom sidewall of the trench 101. The density of the hydroxyl radicals covering the sidewall of the trench 101 decreases gradually from the top sidewall towards the bottom sidewall of the trench 101.

Since the density of hydroxyl radicals covering the top sidewall is higher than that of the hydroxyl radicals covering the bottom sidewall, the oxidation rate of the top sidewall is higher than the oxidation rate of the bottom sidewall, resulting in a faster rate of silica formation at the top sidewall. Therefore, after the first layer 111 is formed through the reaction, the thickness of the first layer 111 covering the top sidewall is greater than the thickness of the first layer 111 covering the bottom sidewall. The thickness of the first layer 111 decreases gradually from the top sidewall towards the bottom sidewall of the trench 101.

It should be noted that in the low pressure chemical vapor deposition process, since the air pressure of the mixed gas attenuated at a faster rate when it contacts the surface of the substrate 10, the difference between the air pressure of the mixed gas at the bottom of the trench 101 and the air pressure at the top of the trench 101 is larger after the mixed gas is blown; furthermore, after the formation of the first layer 111, the difference between the thickness of the first layer 111 covering the bottom sidewall and bottom of the trench 101 and the thickness of the first layer 111 covering the top sidewall of the trench 101 is larger, that is, the first layer 111 formed by the low pressure chemical vapor deposition process has lower step coverage.

The step coverage of the first layer 111 is related to the aspect ratio of the trench 101. When the mixed gas is blown at the same rate, the higher the aspect ratio is, the longer the attenuation time of the air pressure of the mixed gas is and the greater the air pressure difference between the bottom and the top of the trench 101 is, which, after the formation of the first layer 111, results in a greater thickness difference between the first layer 111 covering the top sidewall of the trench 101 and the first layer 111 covering the bottom sidewall of the trench 101, as well as lower step coverage.

It should be noted that the thickness difference and the step coverage will affect the thickness of the second layer to be formed later. Given the needed step coverage of the overall layer remains unchanged, the larger the thickness difference is or the lower the step coverage is, the greater the thickness of the subsequently formed second layer will be, and the longer the process time is required to form the second layer with the same deposition rate.

In an alternative embodiment, the aspect ratio of the trench 101 ranges from 1 to 100.

In an alternative embodiment, due to the attenuation properties of the air pressure in the low pressure chemical vapor deposition process, the air pressure at the top of the trench 101 is 5-10, for example, 6 Torr, 7 Torr or 8 Torr, and the air pressure at the bottom of the trench 101 is 0 Torr~5 Torr, for example, 2 Torr, 3 Torr or 4 Torr, after the mixed gas is blown.

In an alternative embodiment, the process temperature of the low pressure chemical vapor deposition process is 500° C. to 1000° C., for example, 600° C., 700° C., or 800° C. At this process temperature, the deposition process has a higher deposition rate and can effectively shorten the process time of the first layer 111.

Figure 3:
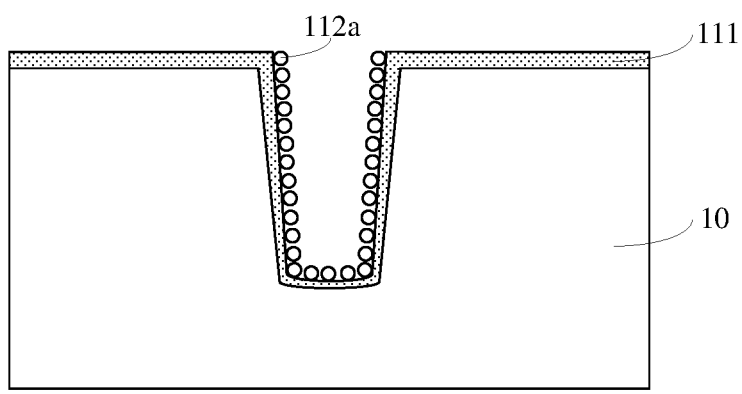
Figure 4:
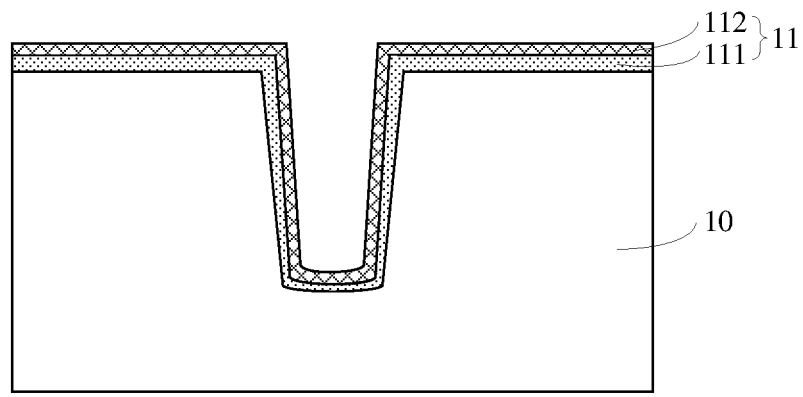

Referring to FIGS. 3 and 4, a second layer 112 covering the surface of the first layer 111 is formed.

In an alternative embodiment, after the formation of the first layer 111 with a lower step coverage and a thickness difference by the low pressure chemical vapor deposition process, the second layer 112 with higher step coverage is formed through the atomic layer deposition process, thereby enabling the overall layer composed of the first layer 111 and the second layer 112 to gain higher step coverage than that of the first layer 111, that is, enabling the overall layer to have higher step coverage.

Since the atomic layer deposition process is self-limiting, that is, the first precursor covered by a second precursor will not combine with other second precursors, a monolayer with uniform thickness will be formed through the reaction of the first precursor and the second precursor. A second layer 112 with higher step coverage can be formed through layer-by-layer formation of the above monolayer, wherein the step coverage of the second layer 112 is higher than that of the first layer 111.

In an alternative embodiment, the material of the second layer 112 is the same as that of the first layer 111, which allows the step coverage of the overall layer composed of the same material to be changed without changing the material properties, thereby ensuring the structure of the overall layer meets the preset electrical requirements; in other embodiments, the material properties of the first layer are different from the material properties of the second layer, and the ways to change the material properties include changing the material itself, implanting doped ions, and adjusting the grain size, etc.

In an alternative embodiment, the second layer 112 is a monolayer structure; in other embodiments, the second layer is a multi-layer structure, wherein at least two layers are of different materials, so that the electrical properties of the overall layer can be adjusted by introducing layers composed of other materials to prevent the electrical properties of the overall layer being affected by a greater minimum thickness.

In this embodiment, the electrical properties of different regions of the overall layer are differentiated by adjusting the step coverage of the overall layer composed of the first layer and the second layer to meet specific electrical requirements; but during the formation of the overall layer, the overall layer with the preset step coverage may be thicker due to the process property limitations of the deposition process, in which case the electrical properties of different regions of the overall layer are weakened though they remain differentiated. At this point, introducing layers composed of other materials can help to adjust the electrical properties of the overall layer to be differentiated in different regions as well as to meet the preset requirements.

In an alternative embodiment, as the second layer 112 is formed by the atomic layer deposition process, wherein any layer contained in the second layer 112 has relatively high step coverage. Therefore, the introduction of sub-layers composed of other materials in the second layer 112 helps to ensure that the sub-layers have the same effect on different regions of the overall layer, that is, to enhance the electrical properties of different regions of the overall layer simultaneously without affecting the differentiation of the electrical properties of different regions, which ultimately enables the electrical properties of the different regions of the overall layer to meet the preset requirements.

Limitations on the process properties of the deposition process comprises at least the following: during the low pressure chemical vapor deposition process, the deposition process itself has a relatively high deposition rate while the deposition time cannot be infinitely shortened due to the performance of the reaction device, the air blowing rate, etc., thereby resulting in a minimum thickness difference in the finally formed first layer 111. When adjusting the step coverage of the overall layer, the overall layer that meets the preset step coverage may be relatively thick because the minimum thickness difference of the first layer is great.

In an alternative embodiment, the formation the second layer 112 comprises the steps of: blowing the first precursor 112a into the reaction chamber to make the first precursor 112a uniformly cover the surface of the first layer 111; blowing the inert gas to purge the first precursor 112a and the derivatives unattached to the surface of the first layer 111; blowing the second precursor (not shown) to make the second precursor react with the first precursor 112a to form the constituent material of the second layer 112; blowing the inert gas to purge the unreacted mixed gas and derivatives; and carrying out the circular reaction to thicken the second layer 112 so that the step coverage of the overall layer meets the preset requirements.

In an example of silica used as the material of the second layer 112, the first precursor 112a may be silicon tetrachloride and the second precursor may be a mixture of hydrogen and oxygen. Oxygen and silicon tetrachloride can form silica and derivative chlorine at high temperature, with silica as the constituent material of the second layer 112; derivative chlorine can react with hydrogen to form hydrogen chloride, which helps to avoid the highly toxic gas chlorine in the reaction waste gas and increases the safety of the reaction.

In an alternative embodiment, the first layer 111 and the second layer 112 serve as the gate dielectric layer 11, that is, the first layer 111 and the second layer 112 together constitute a functional layer with a specific function; in other embodiments, the first layer and the second layer may together constitute other functional layers with a specific function, or the first layer and the second layer may each have a specific function.

Figure 5:
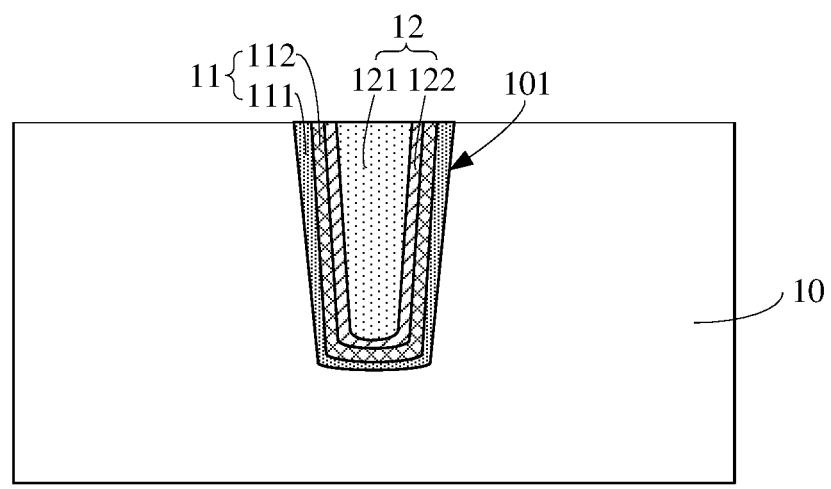

Referring to FIG. 5, the gate 12 is formed.

In an alternative embodiment, after the formation of the gate dielectric layer 11, the gate 12 filled in the trench 101 is formed, which comprises a barrier layer 121 and a metal layer 122, wherein the barrier layer 121 is disposed between the metal layer 122 and the gate dielectric layer 11 to prevent metal ions in the metal layer 122 from migrating into the gate dielectric layer 11 or the substrate 10, thereby ensuring the gate dielectric layer 11 and the substrate 10 have preset properties.

The material of the barrier layer 121 comprises titanium nitride and the material of the metal layer 122 comprises tungsten.

In an alternative embodiment, after the formation of the gate 12, a planarization process is also carried out to remove the material above the top surface of the substrate 10 to form the gate dielectric layer 11 and the gate 12 which are disposed completely within the substrate.

In an alternative embodiment, the gate dielectric layer 11 covering the bottom sidewall and bottom of the trench 101 is relatively thin, which helps to reduce the working voltage of the gate 12; the gate dielectric layer 11 covering the top sidewall of the trench 101 is relatively thick, which helps to reduce the source and drain leakage currents, the gate-induced drain leakage current (GIDL), thereby improving the reliability of the semiconductor structure.

In an alternative embodiment, the combination of two layers with different step coverage allows the overall step coverage of the combined layer to be closer to the second layer, thereby obtaining a combined layer with a median step coverage to meet the corresponding electrical requirements.

Accordingly, the embodiment of the present invention also provides a semiconductor structure, which may be fabricated by the manufacturing method described above.

Referring to FIG. 5, the semiconductor structure comprises: a substrate 10 having a trench 101 therein; a first layer 111 covering the bottom and the sidewall of the trench 101; and a second layer 112 covering the surface of the first layer 111, wherein the step coverage of the second layer 112 is different from that of the first layer 111.

In an alternative embodiment, the step coverage of the second layer 112 is greater than that of the first layer 111, wherein the second layer 112 is a monolayer structure and the first layer 111 has the same material as the second layer 112; in other embodiments, the second layer is a multi-layer structure in which at least two layers have different materials.

In an alternative embodiment, the sidewall of the trench 101 comprise a bottom sidewall and a top sidewall, wherein the first layer 111 covering the bottom sidewall is thinner than the first layer 111 covering the top sidewall in the direction perpendicular to the sidewall of the trench 101. The thickness of the first layer 111 decreases gradually in the direction from the top sidewall toward the bottom sidewall of the trench 101.

In an alternative embodiment, the first layer 111 and the second layer 112 form a gate dielectric layer 11; and the semiconductor structure further comprises: a gate 12 filled in the trench 101.

In an alternative embodiment, the combination of two layers with different step coverage allows the overall step coverage of the combined layer to be closer to the second layer, thereby obtaining a combined layer with an median step coverage to meet the corresponding electrical requirements.

It will be apparent to one of ordinary skill in the art that the above described embodiments are specific embodiments to implement the present invention and that in practical application various revisions in form and detail may be made thereto without departing from the spirit and scope of the present invention. Any person skilled in the art may make their own revisions and modifications without departing from the spirit and scope of the present invention, so the scope of protection of the present invention shall be subject to the scope defined by the claims.

What is claimed is:

1. A semiconductor structure, comprising:
    a substrate of silicon, having a trench therein;
    a first layer covering a bottom and a sidewall of the trench;
    a second layer covering a surface of the first layer, wherein a step coverage of the second layer is different from a step coverage of the first layer; and,
    wherein the first layer is formed by a low pressure chemical vapor deposition process, further comprises:
        a gas pressure at the top of the trench greater than a gas pressure at the bottom of the trench; and
        forming functional groups within the trench, and the functional groups serve to react with the substrate to generate preset material molecules, wherein a density of the functional groups at the bottom of the trench is lower than the density of the functional groups at a top of the trench; and
    the sidewall of the trench comprises a bottom sidewall and a top sidewall, wherein the first layer covering the bottom sidewall is thinner than the first layer covering the top sidewall in a direction perpendicular to the sidewall of the trench.

2. The semiconductor structure of claim 1, wherein the step coverage of the second layer is greater than the step coverage of the first layer.

3. The semiconductor structure of claim 2, wherein the second layer is a multi-layer structure, wherein at least two layers are of different materials.

4. The semiconductor structure of claim 1, wherein a thickness of the first layer decreases gradually from the top sidewall towards the bottom sidewall of the trench.

5. The semiconductor structure of claim 1, wherein the first layer is of the same material as the second layer.

6. The semiconductor structure of claim 1, wherein the first layer and the second layer form a gate dielectric layer; and the semiconductor structure further comprises: a gate filled in the trench.

7. A manufacturing method of a semiconductor structure, comprising:
    providing a substrate of silicon having a trench therein;
    forming a first layer covering a bottom and a sidewall of the trench;
    forming a second layer covering a surface of the first layer, wherein a step coverage of the second layer is different from a step coverage of the first layer; and,
    wherein the first layer is formed by a low pressure chemical vapor deposition process, further comprises:
        a gas pressure at the top of the trench greater than a gas pressure at the bottom of the trench; and
        forming functional groups within the trench, and the functional groups serve to react with the substrate to generate preset material molecules, wherein a density of the functional groups at the bottom of the trench is lower than the density of the functional groups at a top of the trench; and
    the sidewall of the trench comprises a bottom sidewall and a top sidewall, wherein the first layer covering the bottom sidewall is thinner than the first layer covering the top sidewall in a direction perpendicular to the sidewall of the trench.

8. The manufacturing method of claim 7, wherein the second layer is formed by atomic layer deposition process, wherein the step coverage of the second layer is greater than the step coverage of the first layer.

9. The manufacturing method of claim 8, wherein the sidewall of the trench comprises a bottom sidewall and a top sidewall; the low pressure chemical vapor deposition process comprises: forming functional groups covering the sidewall of the trench which is used for immobilizing a first precursor, wherein the functional groups covering the bottom sidewall have a first density and the functional groups covering the top sidewall have a second density, with the second density being higher than the first density; and the first precursor and a second precursor are sequentially blown to the sidewall of the trench, wherein the second precursor is used to react with the immobilized first precursor to generate preset material molecules.

10. The manufacturing method of claim 9, wherein an ambient pressure for forming the functional groups with the second density is 5 Torr to 10 Torr, and the ambient pressure for forming the functional groups with the first density is 0 Torr to 5 Torr.

11. The manufacturing method of claim 7, wherein the first layer and the second layer constitute a gate dielectric layer; and after the formation of the second layer, the semiconductor structure further comprises: a gate filled in the trench.

* * * * *